(12) United States Patent
Yu

(10) Patent No.: US 9,629,277 B2
(45) Date of Patent: Apr. 18, 2017

(54) FASTENER AND SERVER USING THE SAME

(71) Applicant: Wistron Corporation, New Taipei (TW)

(72) Inventor: Yi-Feng Yu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 15/059,331

(22) Filed: Mar. 3, 2016

(65) Prior Publication Data

US 2017/0079157 A1 Mar. 16, 2017

(30) Foreign Application Priority Data

Sep. 10, 2015 (TW) .............................. 104129963 A

(51) Int. Cl.
H05K 7/20 (2006.01)
H05K 7/14 (2006.01)
F16B 45/00 (2006.01)

(52) U.S. Cl.
CPC ........... H05K 7/1489 (2013.01); F16B 45/00 (2013.01)

(58) Field of Classification Search
CPC ..... H05K 7/1489; H05K 5/0221; G06F 1/187
See application file for complete search history.

(56) References Cited

U.S. PATENT DOCUMENTS

| 6,132,235 | A * | 10/2000 | Kitada | H01R 13/6395 439/372 |
| 7,315,458 | B1 * | 1/2008 | Lin | G06F 1/185 174/50 |
| 8,238,096 | B2 * | 8/2012 | Zhen | G06F 1/187 312/223.1 |
| 8,545,249 | B2 * | 10/2013 | Kuan | H01R 13/627 361/679.33 |
| 8,564,960 | B2 * | 10/2013 | Guo | G06F 1/187 248/222.13 |
| 8,941,997 | B2 * | 1/2015 | Zhang | H05K 5/0221 312/223.1 |
| 2004/0120106 | A1 * | 6/2004 | Searby | G06F 1/181 361/679.58 |
| 2006/0274508 | A1 * | 12/2006 | LaRiviere | H05K 7/1488 361/727 |

(Continued)

FOREIGN PATENT DOCUMENTS

TW M425497 U 3/2012
TW 201501120 A 1/2015

OTHER PUBLICATIONS

TIPO Office Action dated May 24, 2016 in corresponding Taiwan application (No. 104129963).

(Continued)

*Primary Examiner* — Anthony Q Edwards
(74) *Attorney, Agent, or Firm* — McClure, Qualey & Rodack, LLP

(57) ABSTRACT

A fastener and a server are provided. The fastener includes a main body, a hook and an elastic portion. The hook connects to the main body and protrudes along in a first direction. The elastic portion connects to the main body and protrudes along a second direction to press against an electronic module, wherein the second direction is substantially perpendicular to the first direction.

11 Claims, 9 Drawing Sheets

(56) References Cited

U.S. PATENT DOCUMENTS

| 2007/0064382 A1* | 3/2007 | Hsiao | G06F 1/184 |
| | | | 361/679.4 |
| 2013/0241378 A1* | 9/2013 | Zhang | H05K 5/0221 |
| | | | 312/223.2 |

OTHER PUBLICATIONS

Partial English translation of TIPO Office Action dated May 24, 2016 in corresponding Taiwan application (No. 104129963).

* cited by examiner

FASTENER AND SERVER USING THE SAME

This application claims the benefit of Taiwan application Serial No. 104129963, filed Sep. 10, 2015, the subject matter of which is incorporated herein by reference.

BACKGROUND OF THE INVENTION

Field of the Invention

The invention relates in general to a fastener and a server using the same, and more particularly to a fastener having an elastic portion and a server using the same.

Description of the Related Art

Conventional server includes at least one electronic component, such as a hard disk or a memory card. In order to fix the electronic component, a fastener is needed to fix the electronic component to a casing of the server. However, due to the fastener having only fixing function, when the electronic component is damaged or is needed to be replaced by another electronic component, the electronic component disposed within the server can't be detached.

SUMMARY OF THE INVENTION

The invention is directed to a fastener and a server using the same, wherein the fastener is capable of fixing and releasing the electronic component.

According to one embodiment of the present invention, a fastener is provided. The fastener includes a main body, a hook and an elastic portion. The hook connects to the main body and protrudes along a first direction. The elastic portion connects to the main body and protrudes along a second direction to press against an electronic module, wherein the second direction is substantially perpendicular to the first direction.

According to another embodiment of the present invention, a server is provided. The server includes a casing and a fastener. The casing has a slot. The fastener includes a hook. An electronic module is disposed on the casing, and the hook is slidably disposed on the slot.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
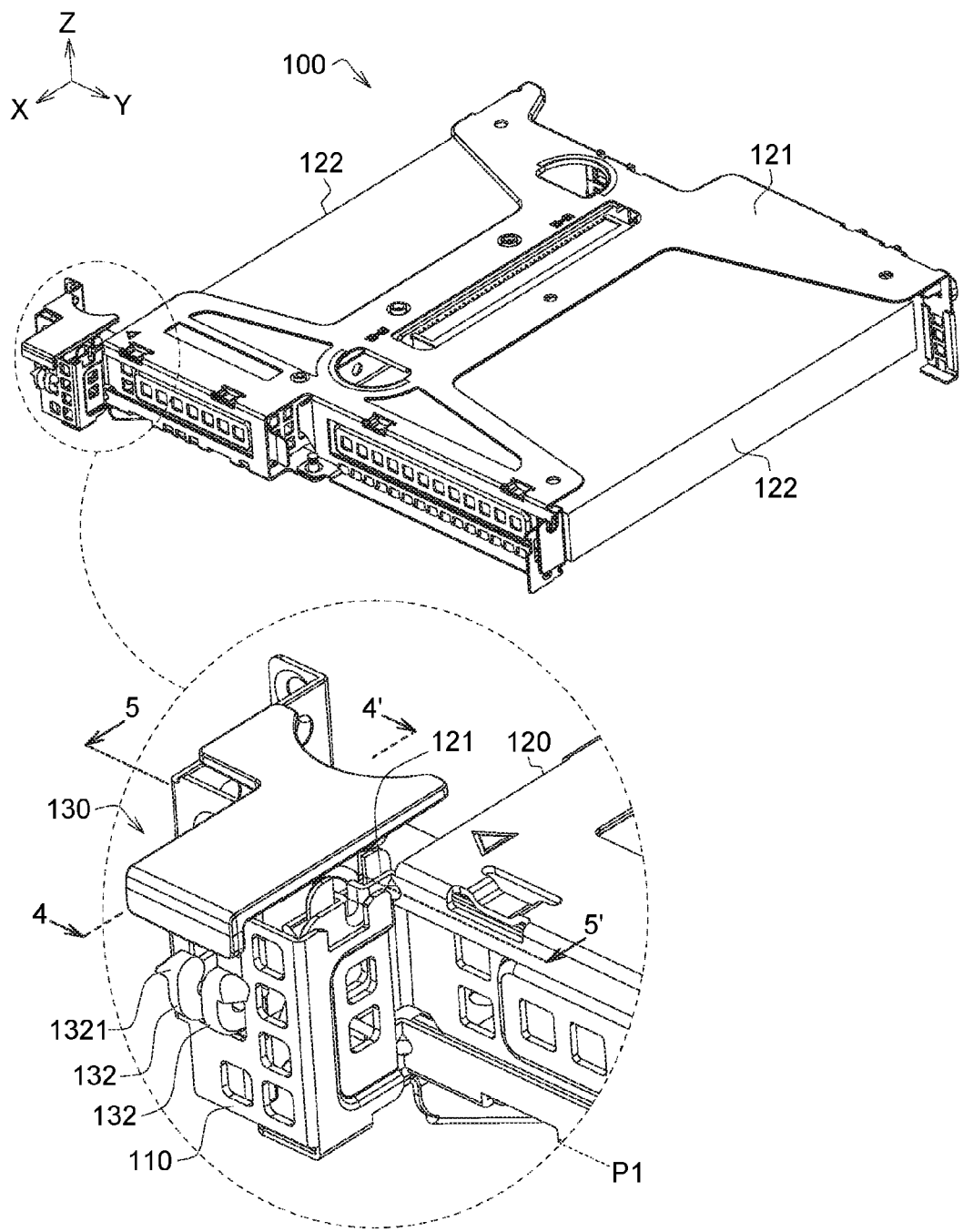
FIG. 1 is a local diagram of a server according to an embodiment of the disclosure.

FIG. 1 is a local diagram of a server 100 according to an embodiment of the disclosure. The server 100 includes a casing 110, an electronic module 120 and a fastener 130.

The casing 110 is, for example, an outer shell. The casing 110 shown in FIG. 1 is a portion of the casing of the server 100.

Figure 7A:
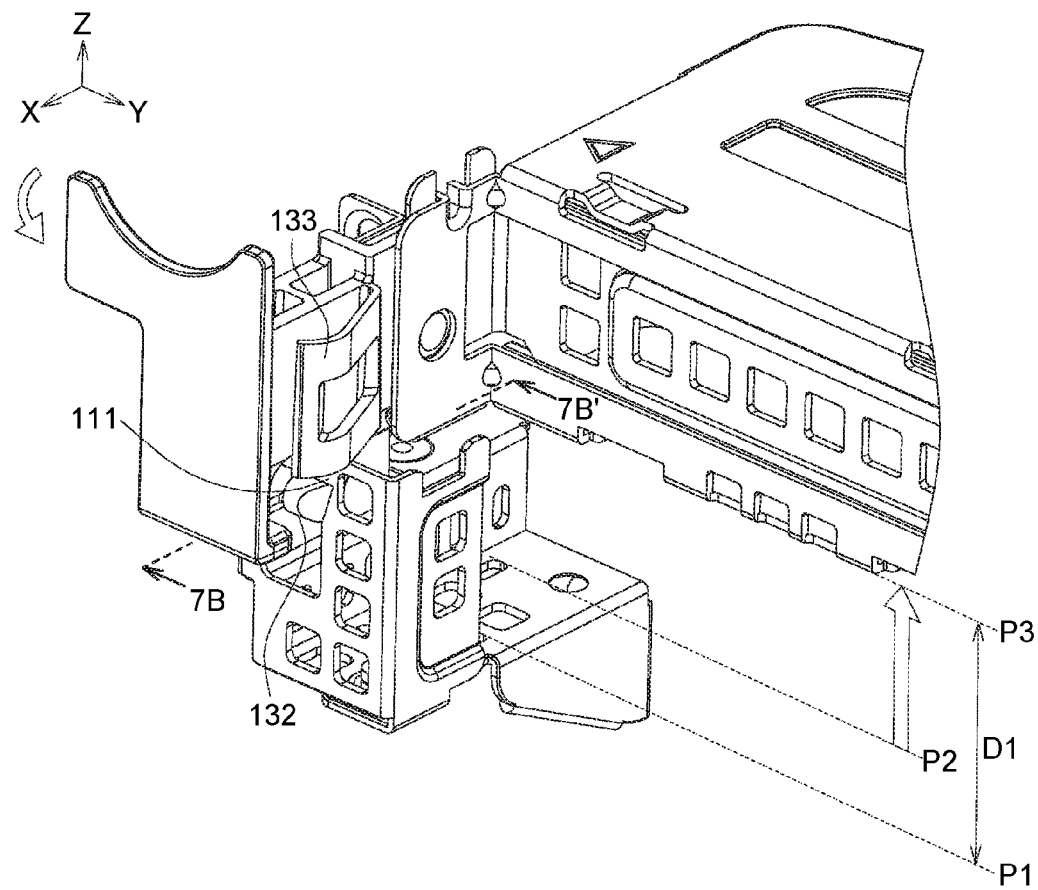
FIG. 7A is a diagram of the electronic module of FIG. 6A being at a release state.

The electronic module 120 is detachably disposed on the casing 110. The fastener 130 may slide in the Z axis for fixing the electronic module 120 to the casing 110 (as shown in FIG. 1) or lifting a fixing relation (as shown in FIG. 7A) between the electronic module 120 and the casing 110. The Z axis is, for example, a detaching and assembling direction. For example, the +Z axis is the direction of the electronic module 120 being detached from the casing 110, and the −Z axis is the direction of the electronic module 120 being assembled (or fixed) to the casing 110.

The electronic module 120 is, for example, a module complying with a PCIE (Peripheral Component Interconnect Express) interface. The electronic module 120 includes a frame 121 and a plurality of electronic components 122. The electronic module 120 may be a butterfly module. The electronic components 122 may be disposed on the frame 121, and detached from or assembled to the casing 110 with the frame 121. Although not shown, when the fastener 130 and the electronic module 120 are at a fixing state, the electronic components 122 may electrically connect to a circuit board (not shown) disposed in the server 100.

Figure 2:
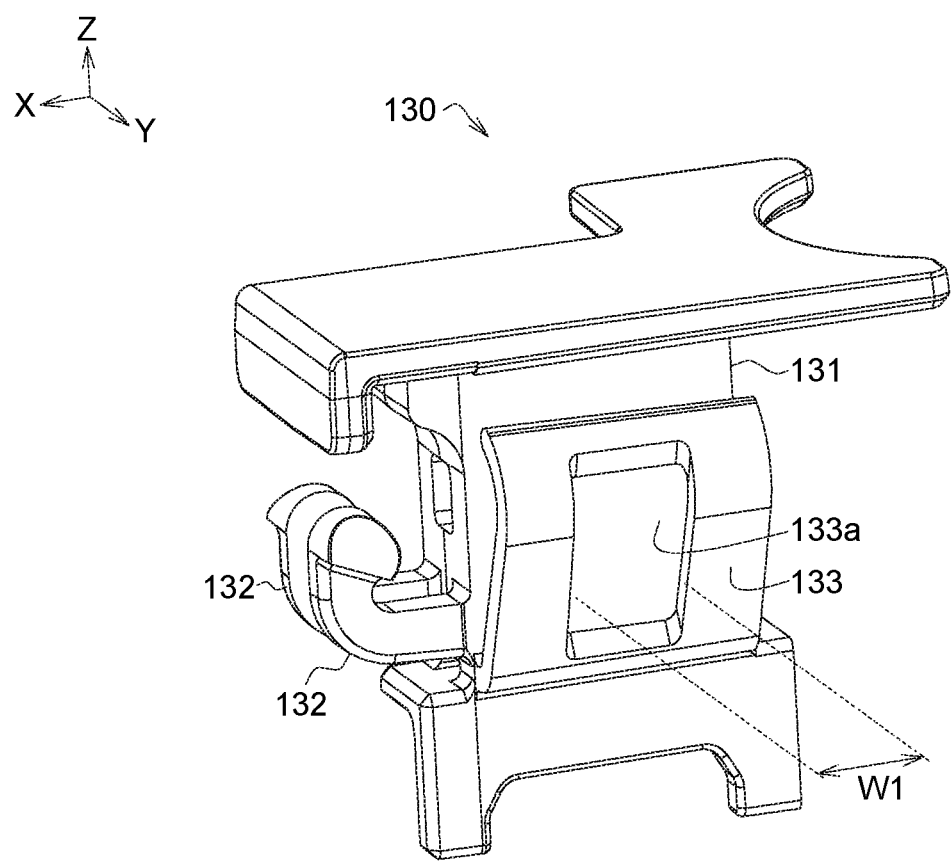
FIG. 2 is a diagram of the fastener of FIG. 1.

FIG. 2 is a diagram of the fastener 130 of FIG. 1. The fastener 130 includes a main body 131, at least one hook 132 and an elastic portion 133. The hook 132 connects to the main body 131 and protrudes along a first direction, wherein the first direction is the X axis, for example. The elastic portion 133 connects to the main body 131 and protrudes along a second direction for pressing against the electronic module 120 and accordingly fixing the electronic module 120 to the casing 110. The second direction is substantially perpendicular to the first direction, and the second direction is, for example, the Y axis. In addition, the elastic portion 133 has an opening 133a for increasing elasticity or flexibility of the elastic portion 133.

Figure 3:
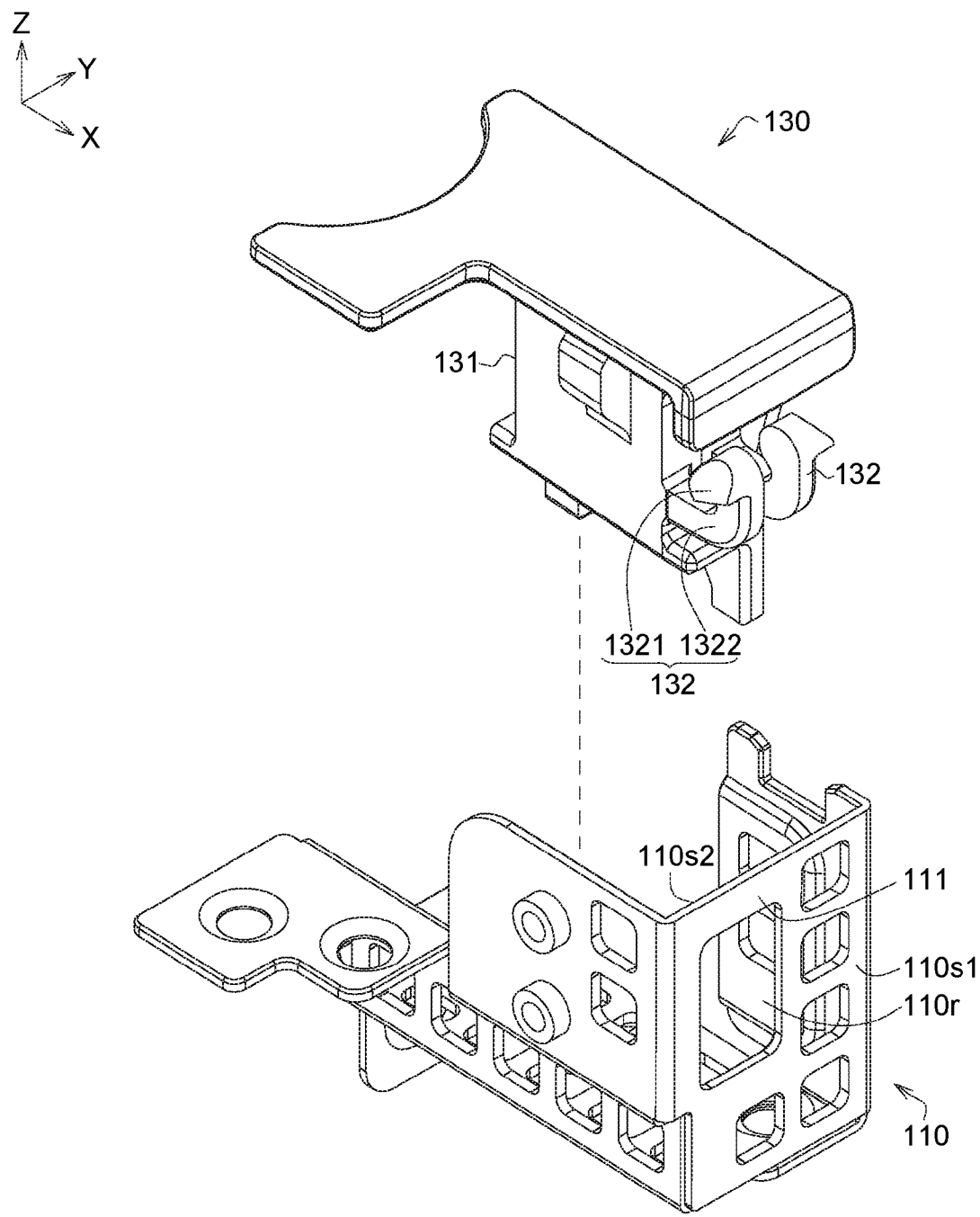
FIG. 3 is an exploded diagram of the fastener and a portion of the casing of FIG. 1.

FIG. 3 is an exploded diagram of the fastener 130 and a portion of the casing 110 of FIG. 1. The casing 110 includes an outer surface 110s1 and an inner surface 110s2 opposite to the outer surface 110s1, a slot 110r and a block portion 111, wherein the hook 132 of the fastener 130 may deposed through the slot 110r (as shown in FIG. 1), such that the hook 132 protrudes from the outer surface 110s1. The hook 132 passing through the slot 110r may slide in the Z axis. Due to the hook 132 being limited to the width of the slot 110r, it is not easy for the hook 132 to shake excessively in the slot 110r along the width direction (for example, in the Y axis). In an embodiment, the opposite two hooks 132 may press against opposite two sidewalls of the slot 110r respectively for increasing stability of sliding between the hook 132 and the slot 110r. In addition, the hook 132 includes a barb 1321 and a cantilever 1322, wherein the cantilever 1322 extends in the first direction, the barb 1321 extends in a third direction. The third direction is substantially perpendicular to the first direction, and the third direction is, for example, the Z axis.

Figure 4:
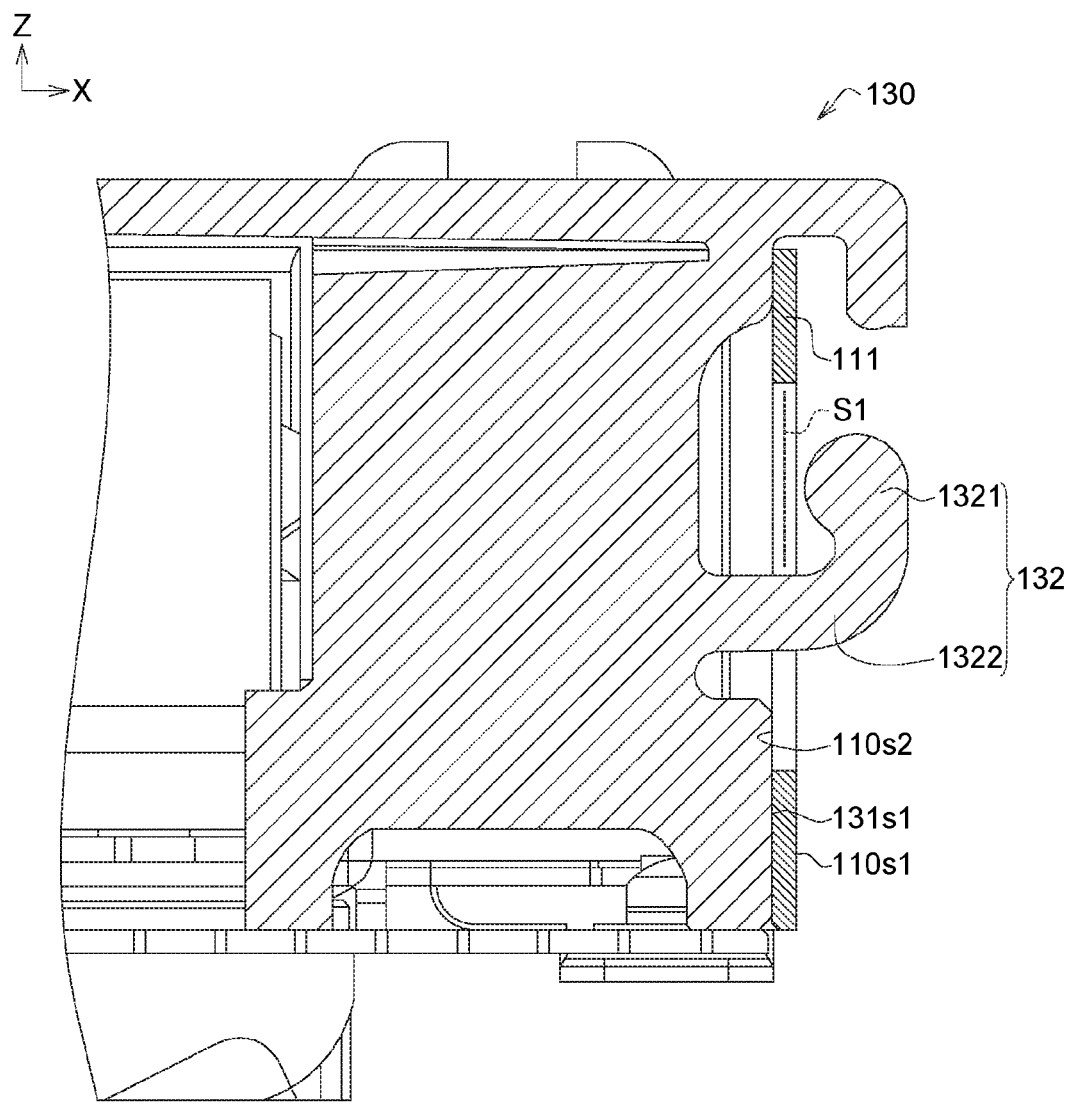
FIG. 4 is an across-sectional view of the server of FIG. 1 along a direction 4-4'.

FIG. 4 is an across-sectional view of the server 100 of FIG. 1 along a direction 4-4'. The block portion 111 is located at an end and at a first sliding path S1 of the hook 132, such that when the cantilever 1322 of the hook 132 slides to the block portion 111, the cantilever 1322 may be blocked by the block portion 111 and rotate about the block portion 111 serving as a fulcrum.

Figure 5:
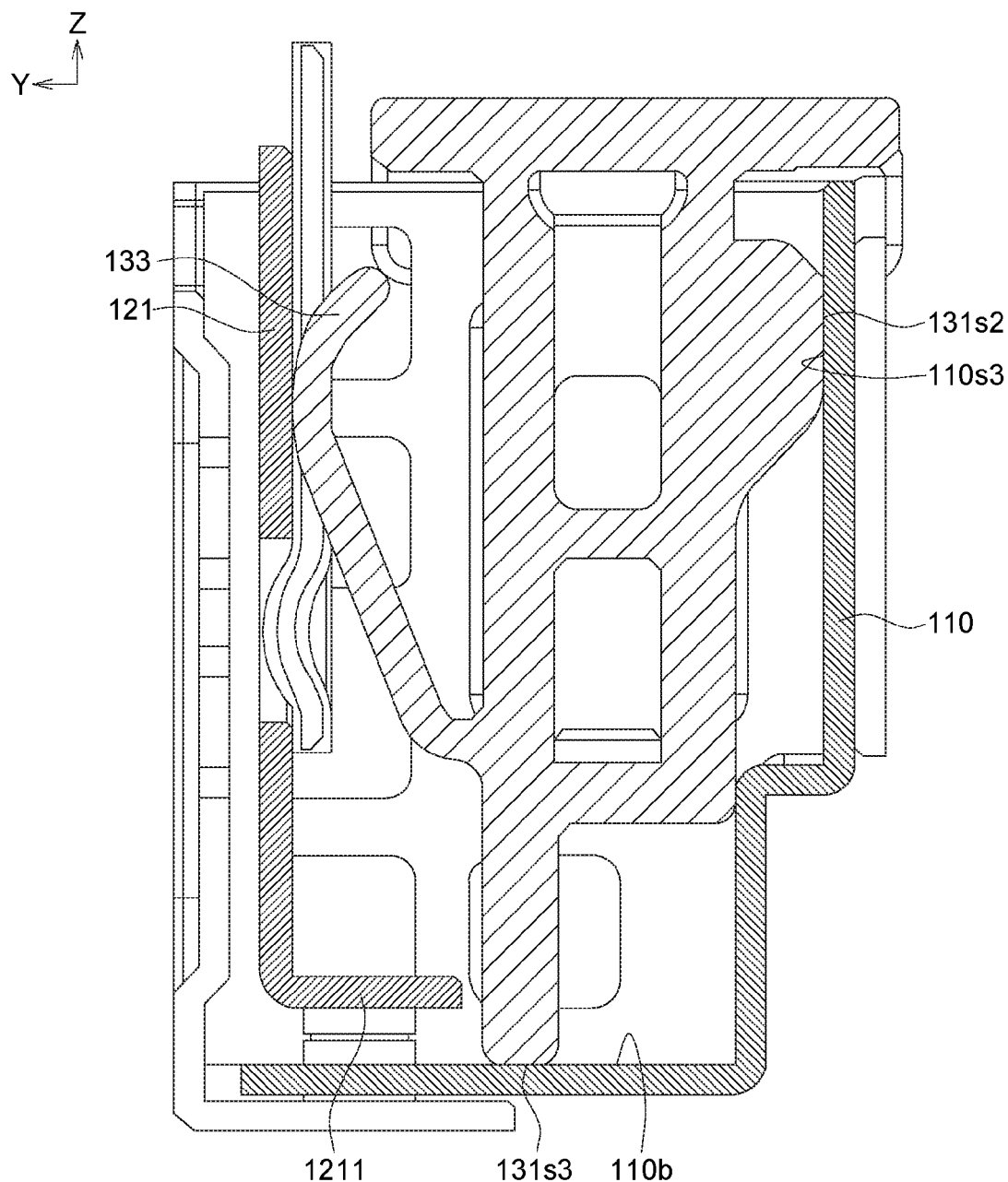
FIG. 5 is an across-sectional view of the server of FIG. 1 along a direction 5-5'.

Referring to FIGS. 4 and 5, FIG. 5 is an across-sectional view of the server 100 of FIG. 1 along a direction 5-5'. The main body 131 has a first pressing surface 131s1, a second pressing surface 131s2 and a third pressing surface 131s3. The hook 132 protrudes from the first pressing surface 131s1, the second pressing surface 131s2 is located at the opposite side of the elastic portion 133, and the third pressing surface 131s3 is a bottom surface of the main body 131.

As shown in FIG. 4, when the fastener 130 fixes the frame 121 of the electronic module 120 to the casing 110, the first pressing surface 131s1 of the main body 131 presses against the inner surface 110s2 of the casing 110, and thus there is no clearance between the first pressing surface 131s1 and the inner surface 110s2 of the casing 110; as a result, the stability of sliding between the fastener 130 and the casing 110 may be increased. Similarly, when the fastener 130 fixes the frame 121 of the electronic module 120 to the casing 110, the second pressing surface 131s2 of the main body 131 presses against another inner surface 110s3 of the casing 110, and thus there is no clearance between the second pressing surface 131s2 and the inner surface 110s3 of the casing 110; as a result, the stability of sliding between the fastener 130 and the casing 110 may be increased. In addition, as shown in FIG. 5, the third pressing surface 131s3 may press against a bottom surface 110b of the casing 110, and accordingly the stability between the fastener 130 and the casing 110 may be increased.

In the present embodiment, the first pressing surface 131s1 and the second pressing surface 131s2 of the fastener 130 are planes, the inner surfaces 110s2 and 110s3 of the casing 110 pressing against the first pressing surface 131s1 and the second pressing surface 131s2 are also planes, and accordingly the stability of sliding between the fastener 130 and the casing 110 may be increased. In addition, the third pressing surface 131s3 of the fastener 130 is plane, and the bottom surface 110b of the casing 110 pressing against the third pressing surface 131s3 is also plane, and accordingly the stability between the fastener 130 and the casing 110 may be increased.

As shown in FIG. 5, when the fastener 130 and the electronic module 120 are at the fixing state, the elastic portion 133 of the fastener 130 presses against the frame 121 of the electronic module 120 for fixing the electronic module 120 and preventing the electronic module 120 from being detached from the casing 110. How to lift the fixing relation between the electronic module 120 and the fastener 130 will be described below.

Figure 6A:
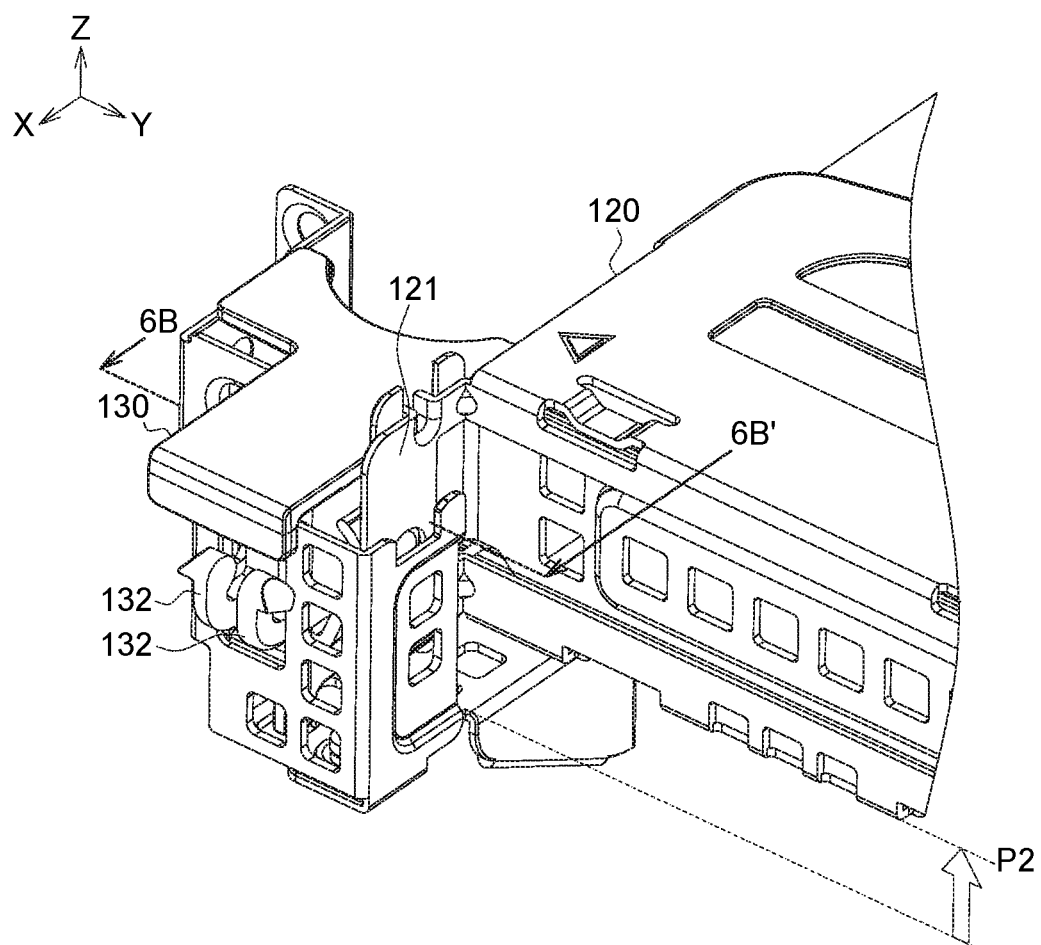
FIG. 6A is a diagram of the electronic module being at an intermediate state.
Figure 6B:
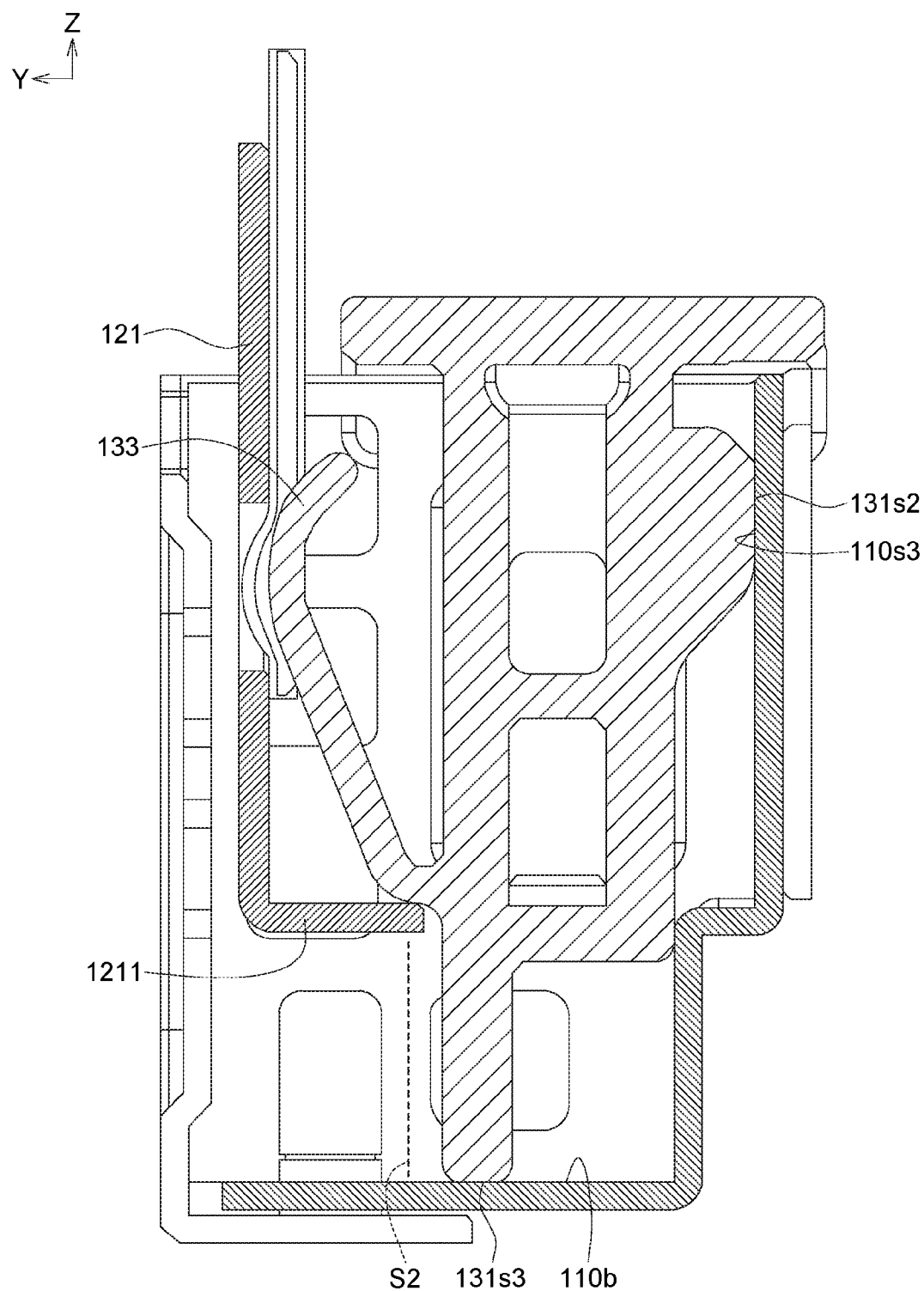
FIG. 6B is an across-sectional view of the electronic module of FIG. 6A along a direction 6B-6B'.

Referring to FIGS. 6A and 6B, FIG. 6A is a diagram of the electronic module 120 being at an intermediate state, and FIG. 6B is an across-sectional view of the electronic module 120 of FIG. 6A along a direction 6B-6B'.

As shown in FIG. 6B, the frame 121 of the electronic module 120 includes a pushing portion 1211, the elastic portion 133 is located at a second sliding path S2 of the pushing portion 1211. As a result, the pushing portion 1211 of the frame 121 is driven when the electronic module 120 moves from a first position P1 shown in FIG. 6A to a second position P2 along the +Z axis. Because the elastic portion 133 is located at the second sliding path S2 of the pushing portion 1211, the pushing portion 1211 shown in FIG. 6B may continuously push the elastic portion 133 to move in the +Z axis until the hook 132 is blocked by the block portion 111 (as shown in FIGS. 3 and 4).

In addition, because the width (not shown) of the pushing portion 1211 along the X axis is larger than a width W1 (as shown in FIG. 2) of the opening 133a of the elastic portion 133, the pushing portion 1211 does not enter the opening 133a even if the pushing portion 1211 slides to a neighbor of the opening 133a (since the elastic portion 133 has flexibility, it is possible that the pushing portion 1211 slides the neighbor of the opening 133a). As a result, it prevents the fastener 130 from dropping toward the −Z axis.

Figure 7B:
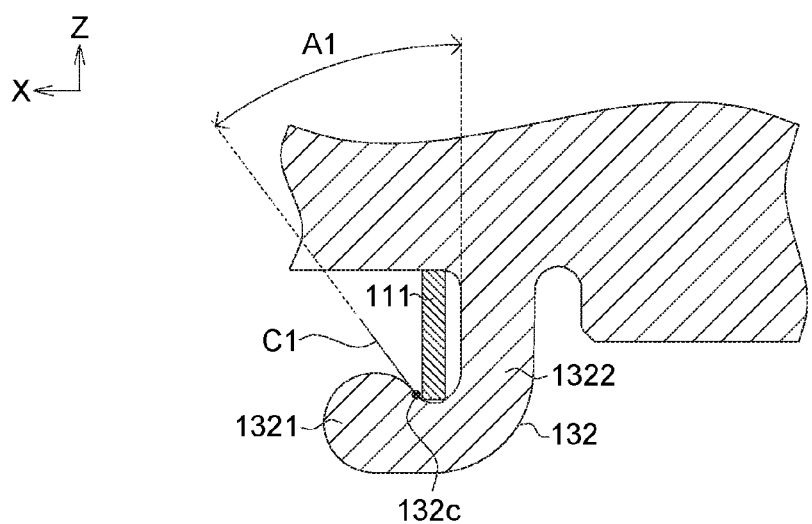
FIG. 7B is an across-sectional view of the electronic module of FIG. 7A along a direction 7B-7B'.

Referring to FIGS. 7A and 7B, FIG. 7A is a diagram of the electronic module 120 of FIG. 6A being at a release state, and FIG. 7B is an across-sectional view of the electronic module 120 of FIG. 7A along a direction 7B-7B'.

When the electronic module 120 shown in FIG. 7A moves from the second position P2 to a third position P3 in the +Z axis, the fastener 130 moves in the +Z axis until the hook 132 is blocked by the block portion 111 of the casing 110. Then, the fastener 130 rotates about the +Y axis and the block portion 111 serving as a fulcrum, until the elastic portion 133 and the electronic module 120 are detached from each other, such that the fixing relation between the fastener 130 and the electronic module 120 will be released.

As shown in FIG. 7B, an angle A1 between the cantilever 1322 and a tangent plane C1 of a connection 132c between the barb 1321 and the cantilever 1322 is equal to or less than 90 degrees. As a result, when the fastener 130 and the casing 110 rotate relatively, it is not easy for the barb 1321 to detach from the block portion 111. In another embodiment, the angle A1 between the tangent plane C1 and the cantilever 1322 may be substantially larger than 135 degrees. In the present embodiment, the barb 1321 has an end portion, and a terminal of the end portion may be circle, oval or polygonal.

In addition, a sliding distance D1 of the electronic module 120 moving to the third position P3 of FIG. 7A from the position P1 of FIG. 7A is substantially equal to a depth of the electronic component 122 inserting into a connector (not shown), wherein the connector is disposed on the circuit board (not shown) within the server 100. Furthermore, the electronic components 122 may include a gold finger (not shown), and the connector is, for example, female connector, such as a slot. The sliding distance D1 is substantially equal to the depth of the gold finger inserting into the slot. When the electronic module 120 moves to the third position P3 from the first position P1 of FIG. 7A, it represents that the electronic components 122 are completely detached from the circuit board. When the electronic module 120 moves to the first position P1 from the third position P3 of FIG. 7A, it represents that the electronic components 122 completely inserts into the connector.

As described above, the fastener 130 of the present embodiment not only may fix the electronic module 120 to the casing 110, but also may release the electronic module 120. As a result, when the electronic component 122 is needed to be replaced, the electronic components 122 may be released and taken out, and then another electronic component 122 may be fixed to the casing 110 of the server 100. In addition, as described above, the electronic module 120 may be operated to move in the +Z axis for driving the fastener 130 to slide and rotate, until the fixing relation between the fastener 130 and the electronic module 120 is lifted. When the fixing relation between the fastener 130 and the electronic module 120 is lifted, the hook 132 of the fastener 130 is blocked by the casing 110, and accordingly it prevents the fastener 130 from being detached from the casing 110; however, such exemplification is not meant to be for limiting. In another embodiment, the fastener 130 may be operated to slide, within the slot 110r, to the block portion 111, and then the fastener 130 rotate about the +Y axis and the block portion 111 serving as a fulcrum, until the elastic portion 133 is detached from the electronic module 120. Then, the electronic module 120 may be taken out.

Figure 8A:
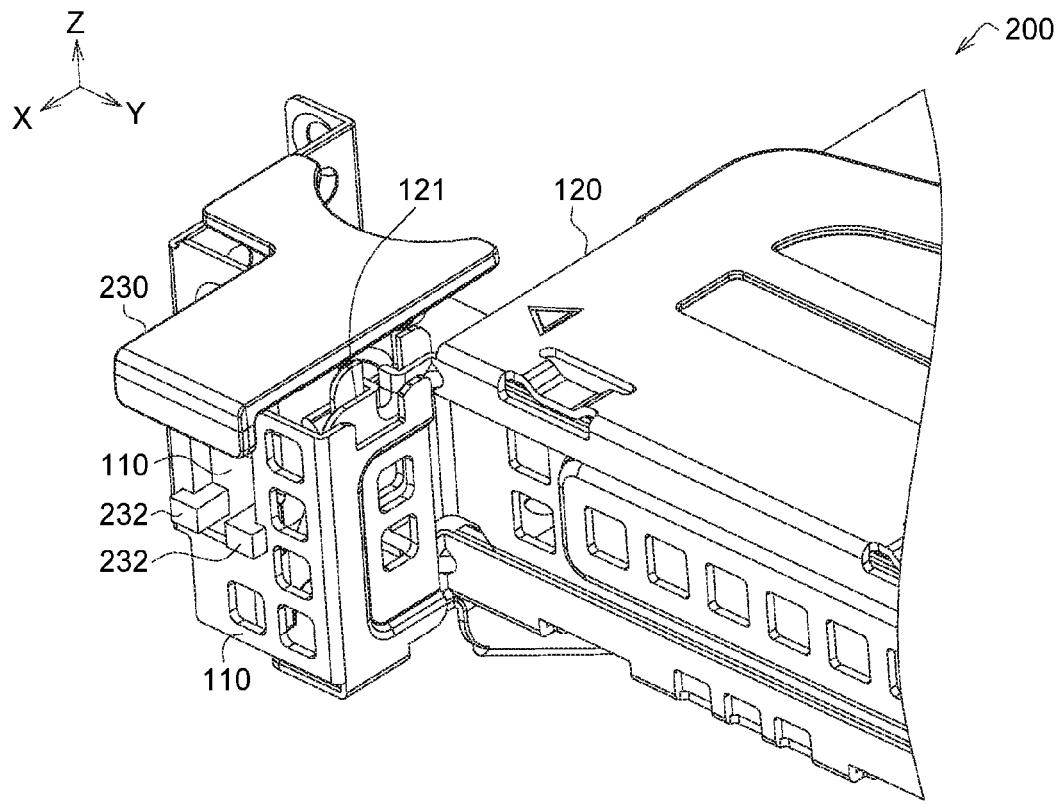
FIG. 8A is a diagram of a server according to another embodiment.
Figure 8B:
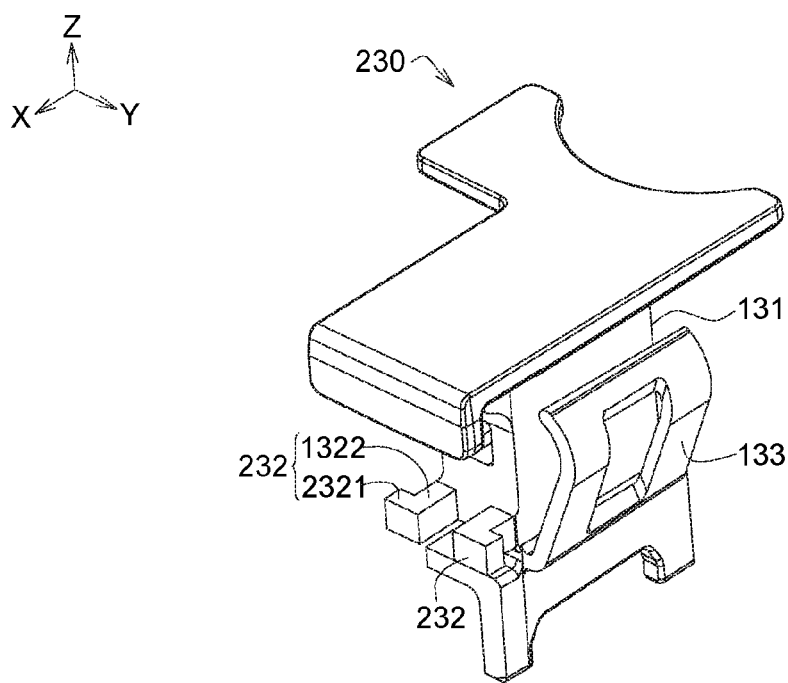
FIG. 8B is a diagram of a fastener of FIG. 8A.

Referring to FIGS. 8A and 8B, FIG. 8A is a diagram of a server 200 according to another embodiment, and FIG. 8B is a diagram of a fastener 230 of FIG. 8A.

The server 200 includes the casing 110, the electronic module 120 and the fastener 230. The fastener 230 includes the main body 131, at least one hook 232 and the elastic portion 133. The hook 232 includes the cantilever 1322 and a barb 2321. The hook 232 of the present embodiment is different from the hook 132 in that the barb 2321 of the hook 232 extends in the second direction. In another embodiment, the hook 232 may omit the barb 2321. In addition, the casing 110 of the present embodiment may omit the block portion 111; as a result, the fastener 230 may move in the +Z axis, until the fastener 230 is completely detached from casing 110 (during this process of moving, the fastener 230 may not rotate) for lifting the fixing relation between the electronic module 120 and the casing 110.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fastener, comprising:
a main body;
a hook connecting to the main body and protruding along a first direction; and
an elastic portion connecting to the main body and protruding along a second direction to press against an electronic module, wherein the second direction is substantially perpendicular to the first direction;
wherein the hook comprises:
a cantilever; and
a barb connecting to the cantilever, wherein the barb is blocked by a casing of a block portion of a server and rotate about the block portion serving as a fulcrum.

2. The fastener according to claim 1, wherein an angle between the cantilever and a tangent plane of a connection between the barb and the cantilever is larger than 135 degrees.

3. The fastener according to claim 1, wherein an angle between the cantilever and a tangent plane of a connection between the barb and the cantilever is substantially equal to or less than 90 degrees.

4. The fastener according to claim 1, wherein the cantilever extends in the first direction, and the barb extends in a third direction, wherein the third direction is substantially perpendicular to the first direction.

5. A server, comprising:
a casing having a slot; and
a fastener comprising a hook;
wherein an electronic module is disposed on the casing, and the hook is slidably disposed on the slot;
wherein the hook comprises:
a cantilever; and
a barb connecting to the cantilever, wherein the barb is blocked by a casing of a block portion of the server and rotate about the block portion serving as a fulcrum.

6. The server according to claim 5, wherein the casing has an outer surface, and the hook protrudes from the outer surface.

7. The server according to claim 5, wherein the casing has an inner surface, the fastener further comprises a main body, and the main body presses against the inner surface.

8. The server according to claim 5, wherein the block portion is located at an end of the slot and at a first sliding path of the hook.

9. The server according to claim 5, wherein an angle between the cantilever and a tangent plane of a connection between the barb and the cantilever is substantially equal to or less than 90 degrees.

10. The server according to claim 5, wherein an angle between the cantilever and a tangent plane of a connection between the barb and the cantilever is larger than 135 degrees.

11. The server according to claim 5, wherein the electronic module has a pushing portion, the fastener further comprises an elastic portion, and the elastic portion is located at a second sliding path of the pushing portion.

* * * * *